(12) United States Patent
Lo et al.

(10) Patent No.: US 11,532,730 B2
(45) Date of Patent: Dec. 20, 2022

(54) METHOD OF FORMING A FINFET DEVICE BY IMPLANTATION THROUGH CAPPING LAYER

(71) Applicant: Taiwan Semiconductor Manufacturing Company Ltd., Hsin-Chu (TW)

(72) Inventors: Wen-Cheng Lo, Zhubei (TW); Sun-Jay Chang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 113 days.

(21) Appl. No.: 16/939,609

(22) Filed: Jul. 27, 2020

(65) Prior Publication Data
US 2020/0357900 A1    Nov. 12, 2020

Related U.S. Application Data

(62) Division of application No. 15/430,063, filed on Feb. 10, 2017, now Pat. No. 10,727,319, which is a
(Continued)

(51) Int. Cl.
*H01L 29/66* (2006.01)
*H01L 29/78* (2006.01)
(Continued)

(52) U.S. Cl.
CPC .... *H01L 29/66795* (2013.01); *H01L 21/0228* (2013.01); *H01L 21/02299* (2013.01);
(Continued)

(58) Field of Classification Search
CPC ................. H01L 21/324; H01L 21/265; H01L 29/66795; H01L 29/7851; H01L 29/7853;
(Continued)

(56) References Cited

U.S. PATENT DOCUMENTS 7,465,636 B2 * 12/2008 Chang ............... H01L 29/42384
257/E21.412
7,977,706 B2   7/2011  Lochtefeld
(Continued)

OTHER PUBLICATIONS

Kwan-Yong Lim et al., "Novel Stress-Memorization-Technology (SMT) for High Electron Mobility Enhancement of Gate Last High-K/ Metal Gate Devices", Semiconductor R&D Center, Advanced Institute of Technology, IEDM10-229, 2010 IEEE, 4 pages.
(Continued)

*Primary Examiner* — Wasiul Haider
(74) *Attorney, Agent, or Firm* — Haynes and Boone, LLP (57) ABSTRACT

Stress memorization techniques (SMTs) for fin-like field effect transistors (FinFETs) are disclosed herein. An exemplary method includes forming a capping layer over a fin structure; forming an amorphous region within the fin structure while the capping layer is disposed over the fin structure; and performing an annealing process to recrystallize the amorphous region. The capping layer enables the fin structure to retain stress effects induced by forming the amorphous region and/or performing the annealing process.

20 Claims, 11 Drawing Sheets

Related U.S. Application Data division of application No. 14/632,489, filed on Feb. 26, 2015, now Pat. No. 9,570,587, which is a division of application No. 13/369,116, filed on Feb. 8, 2012, now abandoned.

(51) Int. Cl.

| | | |
|---|---|---|
| *H01L 21/02* | (2006.01) | |
| *H01L 21/265* | (2006.01) | |
| *H01L 21/324* | (2006.01) | |
| *H01L 29/08* | (2006.01) | |

(52) U.S. Cl.
CPC .......... *H01L 21/265* (2013.01); *H01L 21/324* (2013.01); *H01L 29/0847* (2013.01); *H01L 29/785* (2013.01); *H01L 29/7847* (2013.01); *H01L 29/7848* (2013.01); *H01L 29/7851* (2013.01); *H01L 29/7853* (2013.01)

(58) Field of Classification Search
CPC .............. H01L 29/0847; H01L 29/785; H01L 29/7847; H01L 29/7848
See application file for complete search history.

(56) References Cited

U.S. PATENT DOCUMENTS

| | | | |
|---|---|---|---|
| 8,343,838 B2 | 1/2013 | Koester | |
| 8,394,684 B2 | 3/2013 | Kanakasabapathy et al. | |
| 8,658,505 B2 | 2/2014 | Cai et al. | |
| 8,729,627 B2 | 5/2014 | Cheng et al. | |
| 9,570,587 B2* | 2/2017 | Lo ..................... | H01L 21/02299 |
| 2006/0011984 A1* | 1/2006 | Currie ............... | H01L 21/76254 |
| | | | 257/352 |
| 2008/0116517 A1 | 5/2008 | Anderson et al. | |
| 2009/0072276 A1 | 3/2009 | Inaba | |
| 2010/0084705 A1* | 4/2010 | Radic ................ | H01L 29/66734 |
| | | | 257/330 |
| 2010/0155835 A1* | 6/2010 | Seliskar ............ | H01L 29/42384 |
| | | | 257/331 |
| 2011/0291100 A1* | 12/2011 | Cheng ................ | H01L 29/7841 |
| | | | 257/66 |
| 2012/0018730 A1* | 1/2012 | Kanakasabapathy ... | H01L 21/82 |
| | | | 257/66 |
| 2012/0104474 A1 | 5/2012 | Yin | |
| 2012/0171832 A1 | 7/2012 | Toh et al. | |
| 2013/0200455 A1 | 8/2013 | Lo et al. | |
| 2015/0179771 A1 | 6/2015 | Lo et al. | |
| 2016/0163861 A1* | 6/2016 | Park ................ | H01L 21/823468 |
| | | | 257/192 |

OTHER PUBLICATIONS

Semiconductor Manufacturing Technology, Quirk and Serda, Prentice Hall, pp. 78-80, 2001.

\* cited by examiner

METHOD OF FORMING A FINFET DEVICE BY IMPLANTATION THROUGH CAPPING LAYER

The present application is a divisional of U.S. patent application Ser. No. 15/430,063, filed Feb. 10, 2017, now U.S. Pat. No. 10,727,319, which is a divisional of U.S. patent application Ser. No. 14/632,489, filed Feb. 26, 2015, now U.S. Pat. No. 9,570,587, which is a divisional of U.S. patent application Ser. No. 13/369,116, filed Feb. 8, 2012, all of which are incorporated herein by reference in their entirety.

BACKGROUND

As the semiconductor industry has progressed into nanometer technology process nodes in pursuit of higher device density, higher performance, and lower costs, challenges from both fabrication and design issues have resulted in the development of three dimensional designs, such as a fin-like field effect transistor (FinFET). A typical FinFET is fabricated with a thin "fin" (or fin structure) extending from a substrate, for example, etched into a silicon layer of the substrate. The channel of the FET is formed in this vertical fin. A gate is provided over (e.g., wrapping) the fin. It is beneficial to have a gate on both sides of the channel allowing gate control of the channel from both sides. Advantages of FinFET devices include reducing the short channel effect and higher current flow.

Because of the complexity inherent in nonplanar devices, such as FinFETs, a number of techniques used in manufacturing planar transistors are not available in manufacturing nonplanar devices. For example, stress-memorization techniques (SMTs) are applied in high-performance environments to improve nMOS devices. By carefully controlling the amorphization and re-crystallization of a planar device channel, the effects of a stress force applied to the device will remain even after the stressor is removed. The stress effects improve charge mobility through the channel, thereby improving device performance. What is needed is a method of applying SMTs to three-dimensional devices to obtain similar improvements in device performance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The present disclosure relates generally to IC device manufacturing, and more particularly, to a procedure for performing a stress memorization technique (SMT) on a FinFET and to the resulting device.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1:
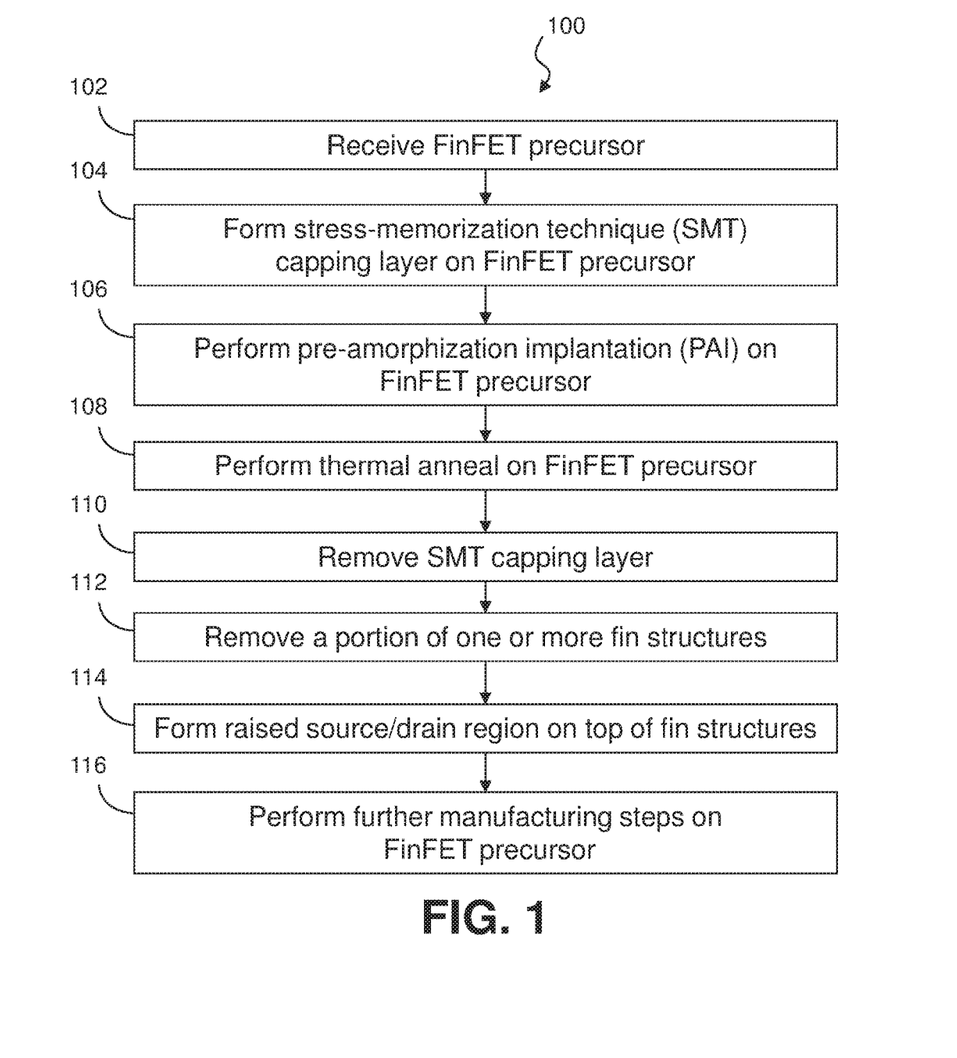
FIG. 1 is a flowchart of a method for performing a stress-memorization technique on a FinFET precursor according to aspects of the present disclosure.

FIG. 1 is a flowchart of a method for performing a stress-memorization technique on a FinFET according to aspects of the present disclosure. FIGS. 2a, 2b, 5a, 6a, 7a, 8, and 9 are diagrammatic perspective views of a FinFET precursor according to embodiments of the present disclosure. FIGS. 3a, 3b, 4, 5b, 6b, 7b, and 10 are sectional views of a FinFET precursor according to embodiments of the present disclosure. The method 100 and the FinFET precursor 200 are collectively described with reference to FIG. 1 through FIG. 10. It is understood that additional steps can be provided before, during, and after the method 100, and some of the steps described can be replaced or eliminated for other embodiments of the method.

Figure 2A:
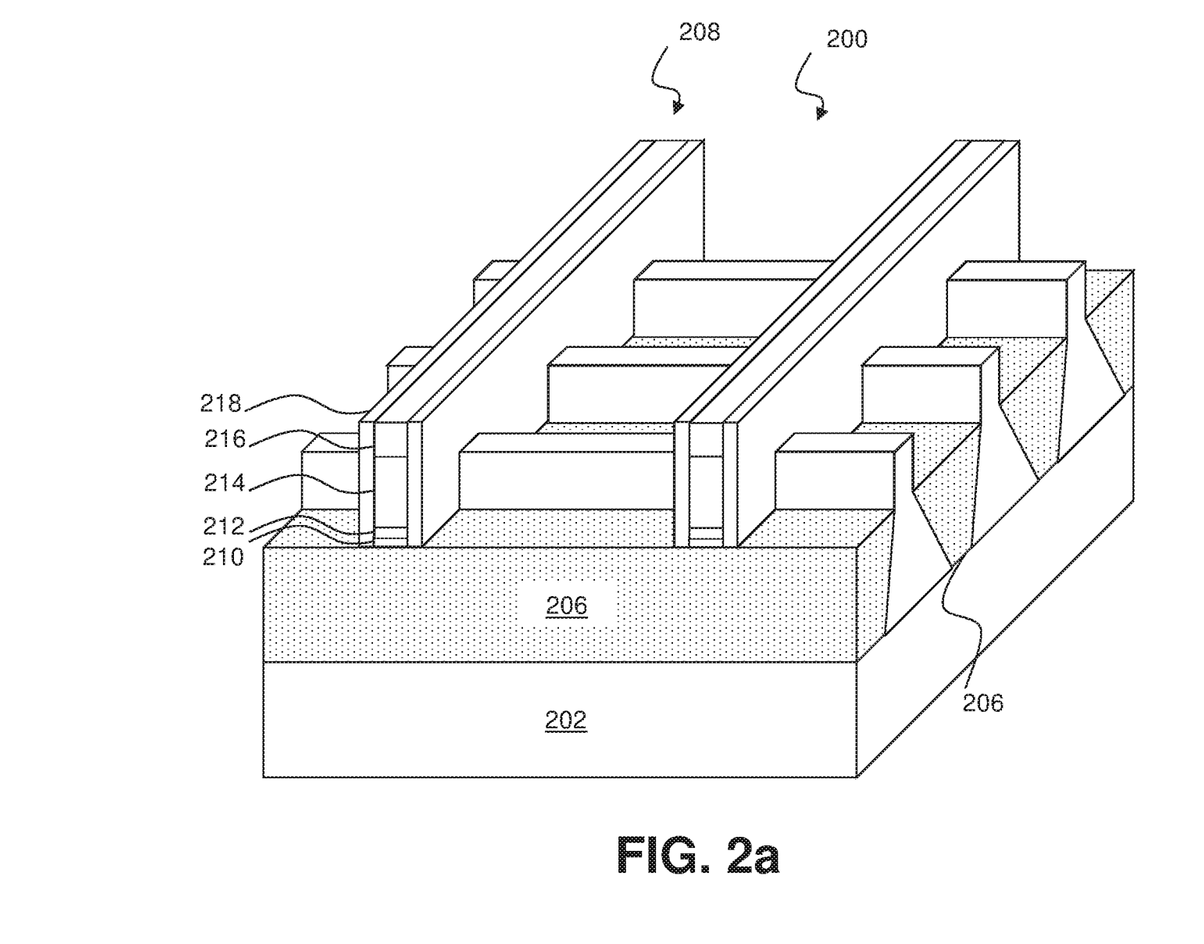
FIGS. 2a and 2b are diagrammatic perspective views of a FinFET precursor undergoing processes according to an embodiment of the present disclosure.

The method 100 begins at block 102 where a FinFET precursor 200 suitable for a stress-memorization technique (SMT) is received. As illustrated in FIG. 2a, the precursor 200 includes a substrate 202. The substrate 202 may be a bulk silicon substrate. Alternatively, the substrate 202 may comprise an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 202 also include a silicon-on-insulator (SOI) substrate. SOI substrates are fabricated using separation by implantation of oxygen (SIMOX), wafer bonding, and/or other suitable methods.

Some exemplary substrates 202 include an insulator layer. The insulator layer comprises any suitable material, including silicon oxide, sapphire, other suitable insulating materials, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary FinFET precursors 200, the insulator layer is a component (e.g., layer) of a silicon-on-insulator substrate.

The substrate 202 may include various doped regions depending on design requirements as known in the art (e.g., p-type wells or n-type wells). The doped regions are doped with p-type dopants, such as boron or $BF_2$; n-type dopants, such as phosphorus or arsenic; or combinations thereof. The doped regions may be formed directly on the substrate 202, in a P-well structure, in an N-well structure, in a dual-well structure, or using a raised structure. The semiconductor substrate 202 may further include various active regions, such as regions configured for an N-type metal-oxide-semiconductor transistor device and regions configured for a P-type metal-oxide-semiconductor transistor device.

A fin structure 204 is formed on the substrate 202. In some embodiments, the precursor 200 comprises more than one fin structures 204. The fin structure 204 is formed by any suitable process including various deposition, photolithography, and/or etching processes. An exemplary photolithography process includes forming a photoresist layer (resist) overlying the substrate (e.g., on a silicon layer), exposing the resist to a pattern, performing a post-exposure bake process, and developing the resist to form a masking element including the resist. The masking element is then used to etch the fin structure into the silicon layer. Area not protected by the masking element is etched using reactive ion etching (RIE) processes and/or other suitable processes. In an example, the silicon fin 204 is formed by patterning and etching a portion of the silicon substrate 202. In another example, the fin structure 204 is formed by patterning and etching a silicon layer deposited overlying an insulator layer (for example, an upper silicon layer of a silicon-insulator-silicon stack of an SOI substrate). As an alternative to traditional photolithography, the fin structure 204 can be formed by a double-patterning lithography (DPL) process. DPL is a method of constructing a pattern on a substrate by dividing the pattern into two interleaved patterns. DPL allows enhanced feature (e.g., fin) density. Various DPL methodologies include double exposure (e.g., using two mask sets), forming spacers adjacent features and removing the features to provide a pattern of spacers, resist freezing, and/or other suitable processes. It is understood that multiple parallel fin structures 204 may be formed in a similar manner.

Suitable materials for forming the fin structure 204 include silicon and silicon germanium. In some embodiments, the fin structure 204 includes a capping layer disposed on the fins, such as a silicon capping layer. The fin structure 204 may also include various doped regions. For example, various doped regions can comprise lightly doped source/drain (LDD) regions and source/drain (S/D) regions (also referred to as heavily doped S/D regions). An implantation process (i.e., a junction implant) is performed to form S/D regions. The implantation process utilizes any suitable doping species. The doping species may depend on the type of device being fabricated, such as an NMOS or PMOS device. For example, the S/D regions are doped with p-type dopants, such as boron or $BF_2$; n-type dopants, such as phosphorus or arsenic; and/or combinations thereof. The S/D regions may comprise various doping profiles. One or more annealing processes may be performed to activate the S/D regions. The annealing processes comprise rapid thermal annealing (RTA) and/or laser annealing processes.

Exemplary isolation regions 206 are formed on the substrate 202 to isolate active regions of the substrate 202. The isolation region 206 utilizes isolation technology, such as shallow trench isolation (STI), to define and electrically isolate the various regions. The isolation region 206 comprises silicon oxide, silicon nitride, silicon oxynitride, an air gap, other suitable materials, or combinations thereof. The isolation region 206 is formed by any suitable process. As one example, the formation of an STI includes a photolithography process, etching a trench in the substrate (for example, by using a dry etching and/or wet etching), and filling the trench (for example, by using a chemical vapor deposition process) with one or more dielectric materials. The trenches may be partially filled, as in the present embodiment, where the substrate remaining between trenches forms a fin structure. In some examples, the filled trench may have a multi-layer structure such as a thermal oxide liner layer filled with silicon nitride or silicon oxide.

One or more gate structures 208 are formed over the substrate 202, including over a portion of the fin structure 204. The gate structure 208 comprises a gate stack and may include a sealing layer and other suitable structures. The gate stack has an interfacial layer 210, a gate dielectric layer 212, a gate electrode layer 214, and a hard mask layer 216. It is understood that the gate stack may comprise additional layers such as interfacial layers, capping layers, diffusion/barrier layers, dielectric layers, conductive layers, other suitable layers, and/or combinations thereof. The interfacial layer 210 of the gate structure 208 is formed over the substrate 202 and fin structure 204. The interfacial layer 210 is formed by any suitable process to any suitable thickness. An exemplary interfacial layer 210 includes silicon oxide (e.g., thermal oxide or chemical oxide) and/or silicon oxynitride (SiON).

The gate dielectric layer 212 is formed over the interfacial layer 210 by any suitable process. The gate dielectric layer 212 comprises a dielectric material, such as silicon oxide, silicon nitride, silicon oxynitride, high-k dielectric material, other suitable dielectric material, and/or combinations thereof. Examples of high-k dielectric material includes $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof.

The gate electrode layer 214 is formed over the gate dielectric layer 212 by any suitable process. The gate electrode layer 214 includes any suitable material, such as polysilicon, aluminum, copper, titanium, tantulum, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof.

The hard mask layer 216 is formed over the gate electrode layer 214 by any suitable process. The hard mask layer 216 comprises any suitable material, for example, silicon nitride, SiON, SiC, SiOC, spin-on glass (SOG), a low-k film, tetraethylorthosilicate (TEOS), plasma enhanced CVD oxide (PE-oxide), high-aspect-ratio-process (HARP) formed oxide, and/or other suitable material.

The gate stack of the gate structure 208 is formed by any suitable process or processes. For example, the gate stack can be formed by a procedure including deposition, photolithography patterning, and etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. Alternatively, the photolithography exposing process is implemented or replaced by other proper methods such as maskless photolithography, electron-beam writing, and ion-beam writing. The etching processes include dry etching, wet etching, and/or other etching methods (e.g., reactive ion etching).

The gate structure 208 may further include a gate spacer 218. The gate spacers 218, which are positioned on each side of the gate stack (on the sidewalls of the gate stack), may comprise a dielectric material, such as silicon nitride, silicon carbide, silicon oxynitride, other suitable materials, and/or combinations thereof. In some embodiments, the gate spacers 218 are used to offset subsequently formed doped regions, such as source/drain regions. The gate spacers 218 may further be used for designing or modifying the source/drain region (junction) profile.

Figure 2B:
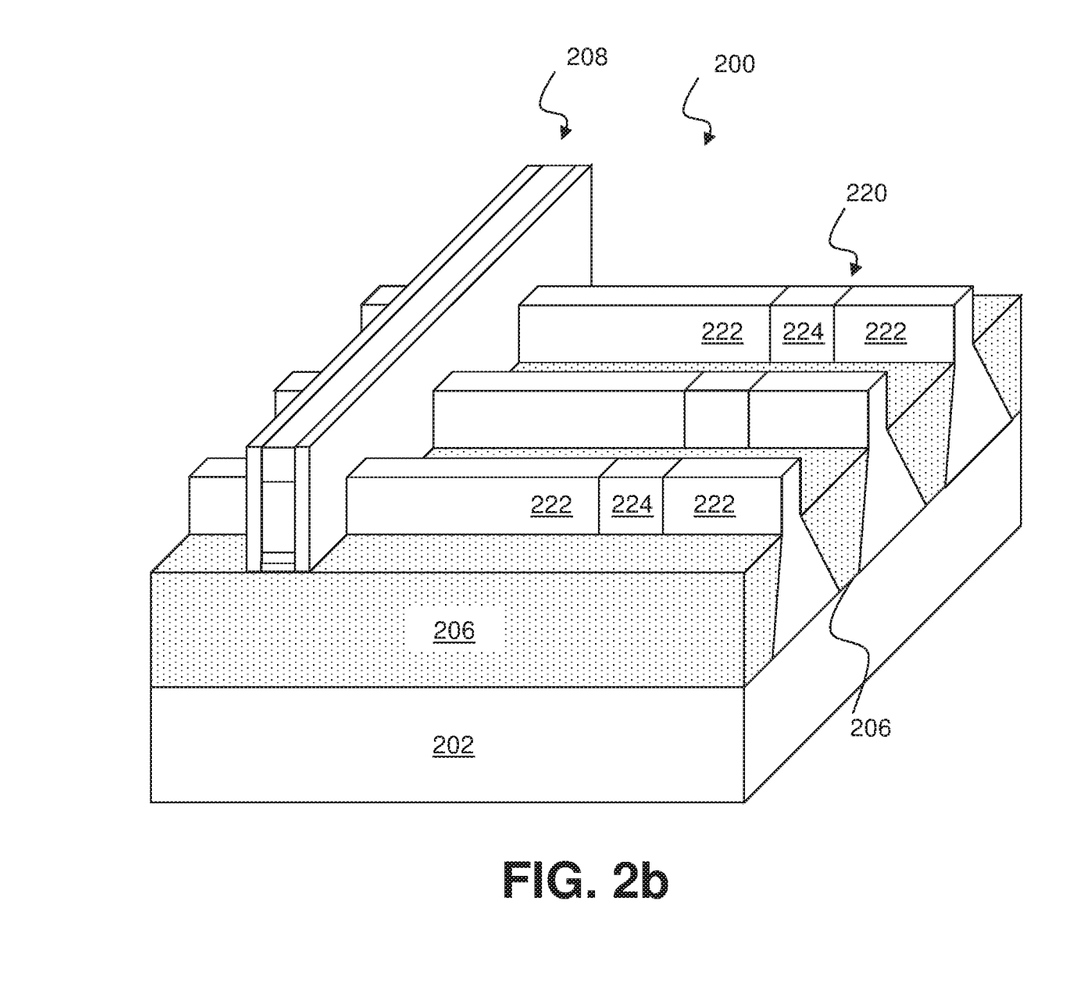

Referring now to FIG. 2b, in some embodiments, the FinFET precursor 200 includes a substrate 202 with an elevated device body 220 formed over the surface of the substrate. The elevated device body has source/drain regions 222. In some embodiments, a source/drain region 222 is a source region, and another source/drain region 222 is a drain region. A gate region 224 is located between the source/drain regions 222. A gate structure 208 is formed over the gate region 224 of the elevated device body 220. In FIG. 2b, one gate structure 208 is not illustrated to better show the underlying gate region 224. Isolation regions 206 separate the elevated device bodies 220 from one another.

Once the FinFET precursor 200 is received, it undergoes a stress-memorization technique (SMT) in blocks 104-110. The SMT increases charge mobility through the channel. This leads to dramatic improvements in device performance. FinFETs having undergone SMT demonstrate higher drive strength for a given channel size and supply voltage. In brief, the method involves forming an SMT capping layer on the FinFET precursor 200. The FinFET 200 undergoes a pre-amorphization implantation (PAI) which injects atoms into the fin structures 204 and disrupts the semiconductor lattice within the fin structures 204. A thermal annealing is performed for re-crystallization. The SMT capping layer is removed, yet the fin structures 204 retain the stress effects caused by the SMT. These retained effects may be referred to as stress-memorization, thus giving SMT its name. After the SMT is completed, further FinFET manufacturing steps may be performed.

Figure 3A:
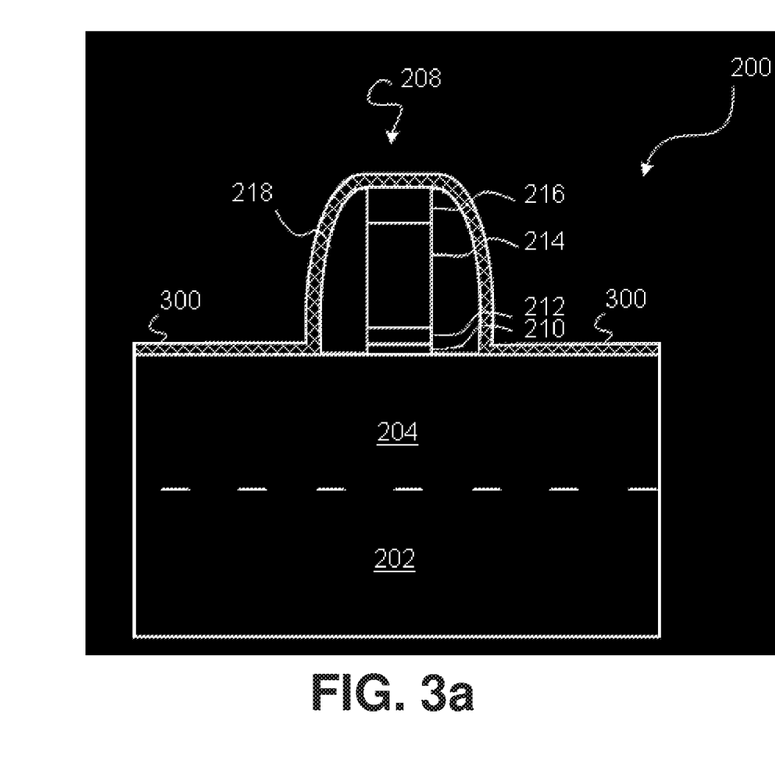
FIGS. 3a and 3b are diagrammatic cross-sectional views of a FinFET precursor undergoing processes according to an embodiment of the present disclosure.
Figure 3B:
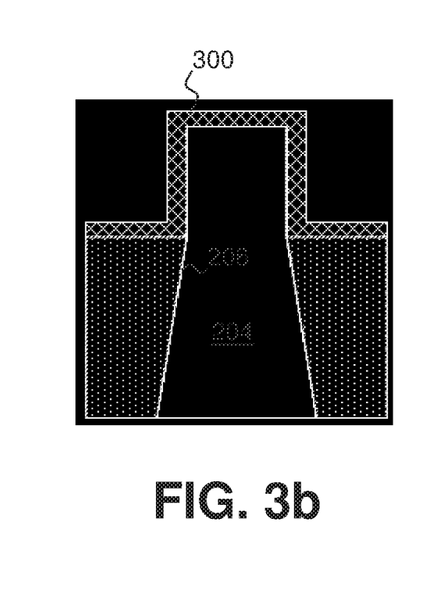

Examining the SMT technique in more detail and referring to block 104 and FIGS. 3a and 3b, an SMT capping layer 300 is formed on the FinFET precursor 200 covering the fin structure 204, the gate structure 208, and, in some embodiments, an exposed portion of the isolation region 206. The capping layer 300 includes silicon nitride or other suitable materials such as silicon oxide. The capping layer 300 may include a silicon nitride formed by a low pressure CVD (LPCVD), a silicon nitride formed by a plasma enhanced CVD (PECVD), tetraethyl orthosilicate formed by a CVD process, a silicon oxide formed by a high aspect ratio process (HARP), or another suitable material. In an embodiment, the capping layer 300 includes a thickness of about 230 angstroms. In another embodiment, the capping layer 300 has a thickness ranging between about 200 angstroms and about 2000 angstroms.

Figure 4:
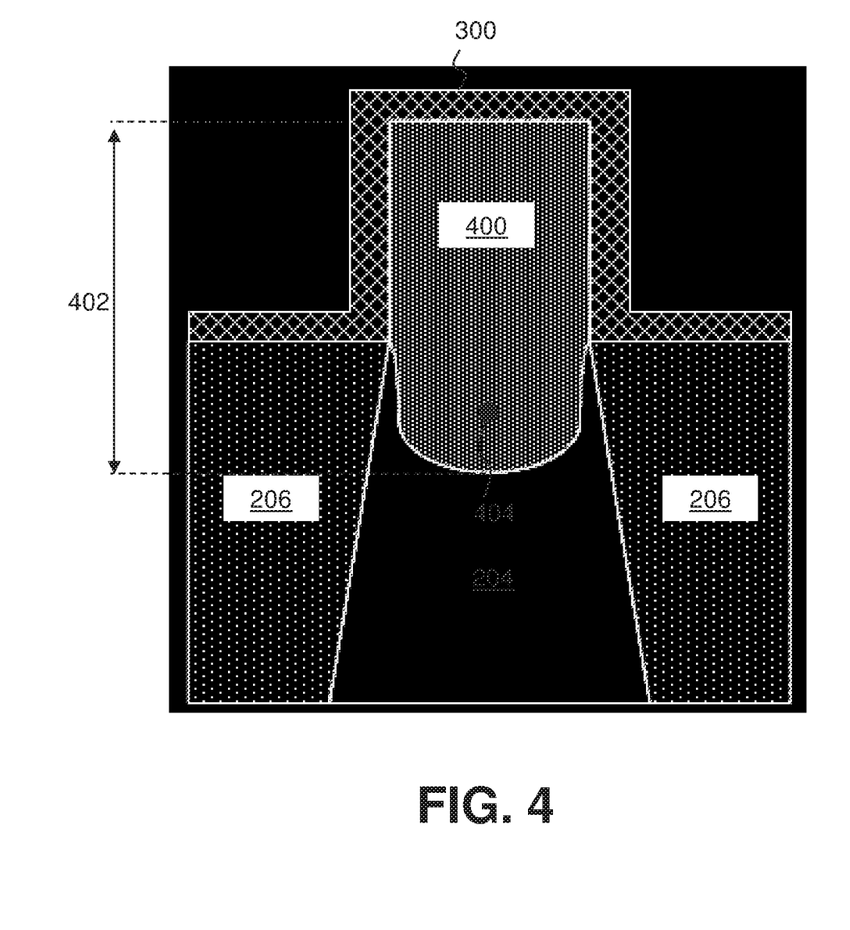
FIG. 4 is a diagrammatic cross-sectional view of a FinFET precursor undergoing processes according to an embodiment of the present disclosure.
Figure 5A:
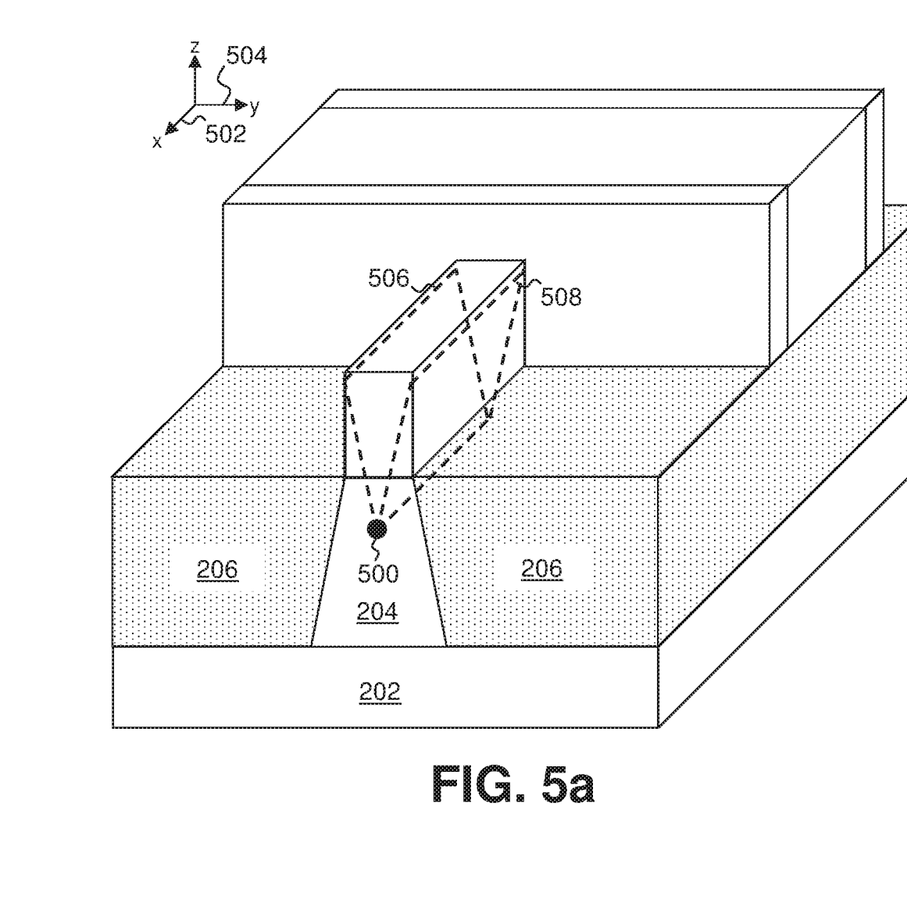
FIGS. 5a and 5b are a diagrammatic perspective view and a diagrammatic cross-sectional view, respectively, of a FinFET precursor undergoing processes according to an embodiment of the present disclosure.
Figure 5B:
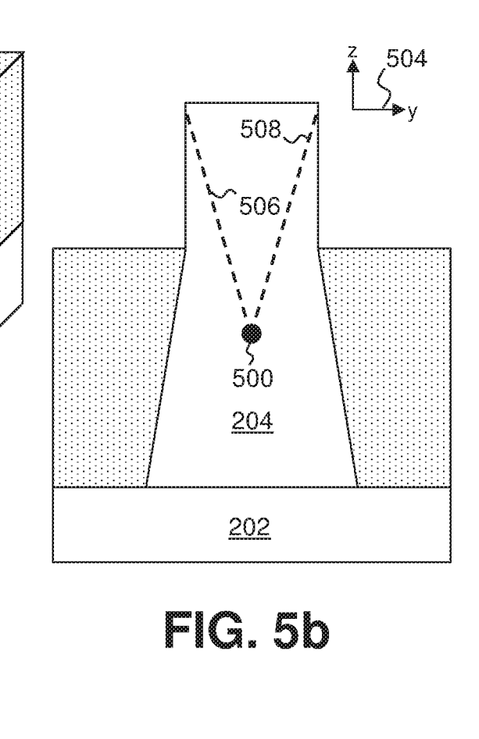
Figure 6A:
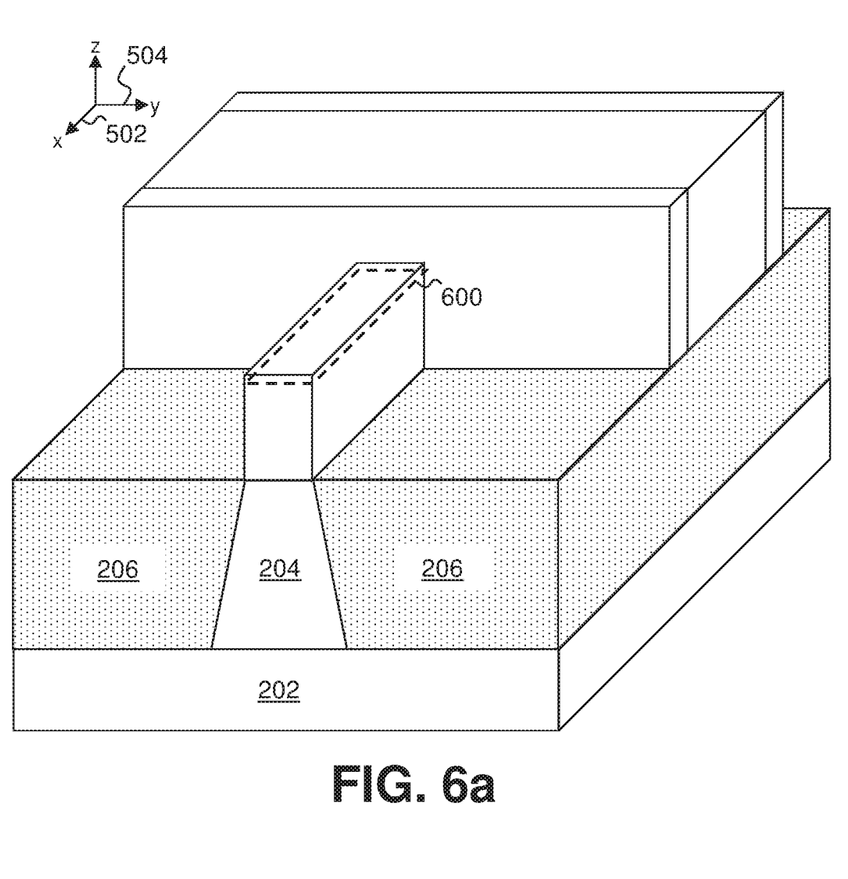
FIGS. 6a and 6b are a diagrammatic perspective view and a diagrammatic cross-sectional view, respectively, of a FinFET precursor undergoing processes according to an embodiment of the present disclosure.
Figure 6B:
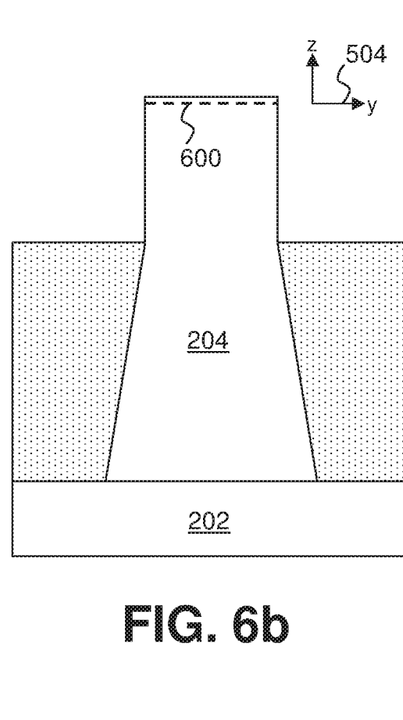
Figure 7A:
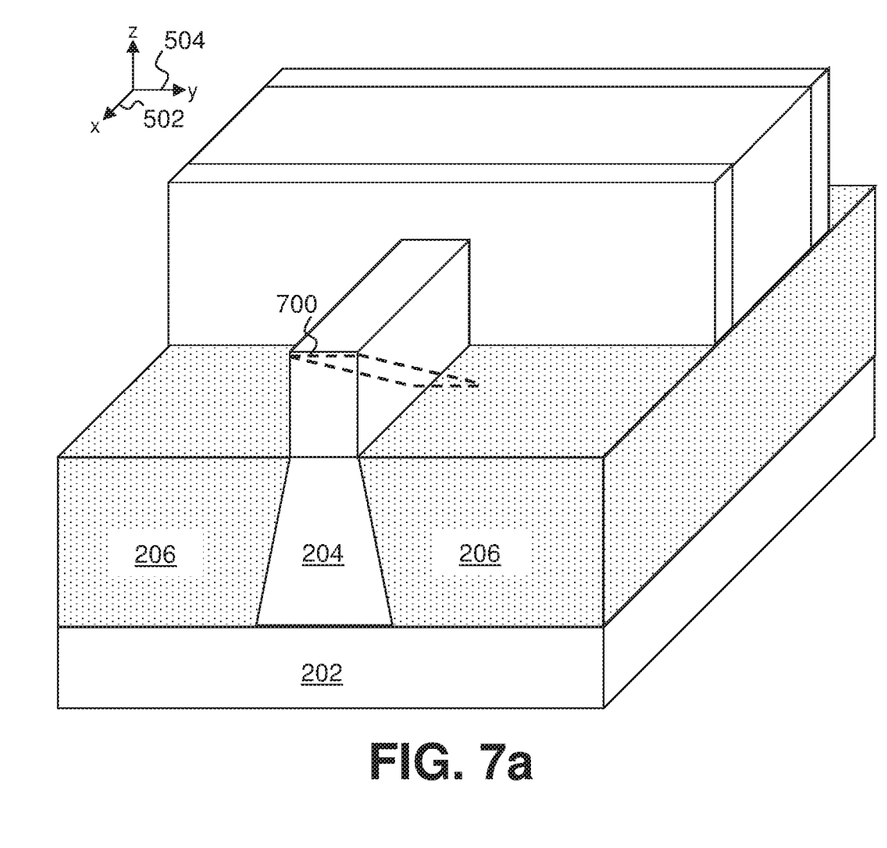
FIGS. 7a and 7b are a diagrammatic perspective view and a diagrammatic cross-sectional view, respectively, of a FinFET precursor undergoing processes according to an embodiment of the present disclosure.
Figure 7B:
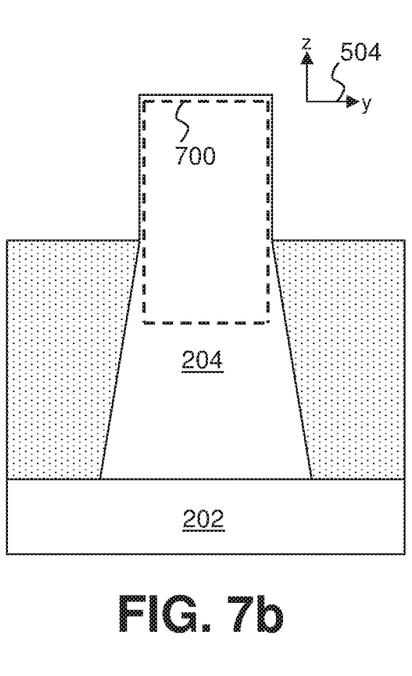

Referring to block 106 and FIG. 4, once the capping layer 300 is applied, a pre-amorphization implantation (PAI) is performed. The PAI injects atoms into the fin structure 204 in the source/drain (S/D) regions. By introducing energetic doping species, such as Si, Ge, Ar, Xe, $BF_2$, As, and/or In into the S/D regions, the implantation damages the molecular lattice. This creates an amorphous region 400 within the semiconductor material of the fin structure 204 down to a depth 402. The depth 402 is determined according to design specifications and can be controlled by the PAI process implant energy, implant species, implantation angle and/or implant dosage. The fin structure 204 may undergo multiple implantations utilizing a variety of energies, species, angles and dosages. In one given embodiment, germanium (Ge) is the species implanted, and the implantation energy ranges between about 25 KeV and about 30 KeV.

In some embodiments, a patterned photoresist layer may be utilized to define where the amorphous region 400 is formed and to protect other regions of the FinFET 200 from implantation damage. For example, the patterned photoresist layer exposes the fin structures 204, such that the source/drain regions are exposed to the PAI process (forming amorphous region 400) while the gate structure 208 (and other portions of the FinFET 200) are protected from the PAI process. Alternatively, a patterned hard mask layer, such as a SiN or SiON layer, is utilized to define the amorphous region 400. The patterned photoresist layer or the patterned hard mask layer may be the hard mask layer 216. Reusing the hard mask layer 216 already in place may reduce cost and manufacturing time.

At block 108, an annealing process is performed on the FinFET precursor 200. When properly performed, the annealing process retains the channel stress effects caused by the capping layer 300 even in the absence of the layer 300. The annealing process re-crystallizes the amorphous regions created during the PAI. However, the stress during annealing prevents uniform crystal formation. The re-crystallized region will contain irregularities such as regions that are locally uniform but exhibit misalignments with other regions. This misalignment may result in imperfections known as dislocations.

The annealing process may be a rapid thermal anneal (RTA) or a millisecond thermal anneal (MSA), such as a millisecond laser thermal anneal. In one embodiment, the annealing process is implemented in a rapid thermal annealing (RTA) tool. In another embodiment, the annealing process is applied to the FinFET 200 with an annealing temperature ranging between about 2000° C. and about 1050° C. In another embodiment, the annealing process is applied to the semiconductor structure 200 with an annealing duration ranging between about 5 seconds and about 30 seconds. The annealing process may include a long range pre-heat, which minimizes or even eliminates end of range (EOR) defects. Suitable ranges for the long range pre-heat range from about 200° C. to about 700° C., and include other appropriate temperatures and ranges. The long range pre-heat may be performed for about 50 to about 300 seconds. In a particular embodiment, the long range pre-heat has a temperature of about 550° C. for about 180 seconds.

At block 110, the capping layer 300 is removed from the FinFET 200. The removal process may include a wet etching or a dry etching process. In one example of the FinFET precursor 200 with a silicon nitride capping layer 300, the capping layer 300 is removed by an etching process involving phosphoric acid. In another example with a silicon oxide capping layer 300, the silicon oxide is etched away by a hydrofluoric acid (HF) or buffered HF. In another example, the silicon oxide capping layer 300 is removed by a CMP process. In some embodiments, it is beneficial to remove other layers, such as a mask layer, simultaneously while removing the capping layer 300.

Referring to FIGS. 5a-7b, due to the stress applied during SMT steps such as SMT layer deposition, implantation, and annealing, the fin structures 204 may contain dislocations in the semiconductor lattice. Dislocations begin at a pinchoff point 500. The depth and location of the pinchoff point 500 is set according to design specifications and is a function of the pre-amorphization implantation and the annealing process. From the pinchoff point, the dislocation propagates along one or more planes. For clarity in illustrating the planes, the capping layer 300 is not shown in FIGS. 5a-7b. The planes are described with reference to the longitudinal axis 502 and transverse axis 504 axis of the fin structure 204. One exemplary plane is illustrated by plane 506. Plane 506 runs parallel to the longitudinal axis 502 of the fin structure 204 but is directed towards the surface of the substrate 202. In some embodiments, plane 506 corresponds to a 111 Miller index. Such a plane 506 intersects the surface of the substrate 202 at about a 55-degree angle. Likewise, plane 508 is similarly parallel to the longitudinal axis 502 of the fin structure 204 and directed towards the surface of the substrate 202. In some embodiments, plane 508 intersects the surface of the substrate 202 at about a 55-degree angle. A further exemplary plane is plane 600, which is parallel to the surface of the substrate 202 and parallel to both the longitudinal axis 502 and transverse axis 504. Plane 700 lies parallel to the transverse axis 504 of the fin structure 204 but angles towards the surface of the substrate 202. These exemplary planes are not intended to be limiting, and a fin structure 204 may possess dislocations along any one or more of these planes.

Figure 8:
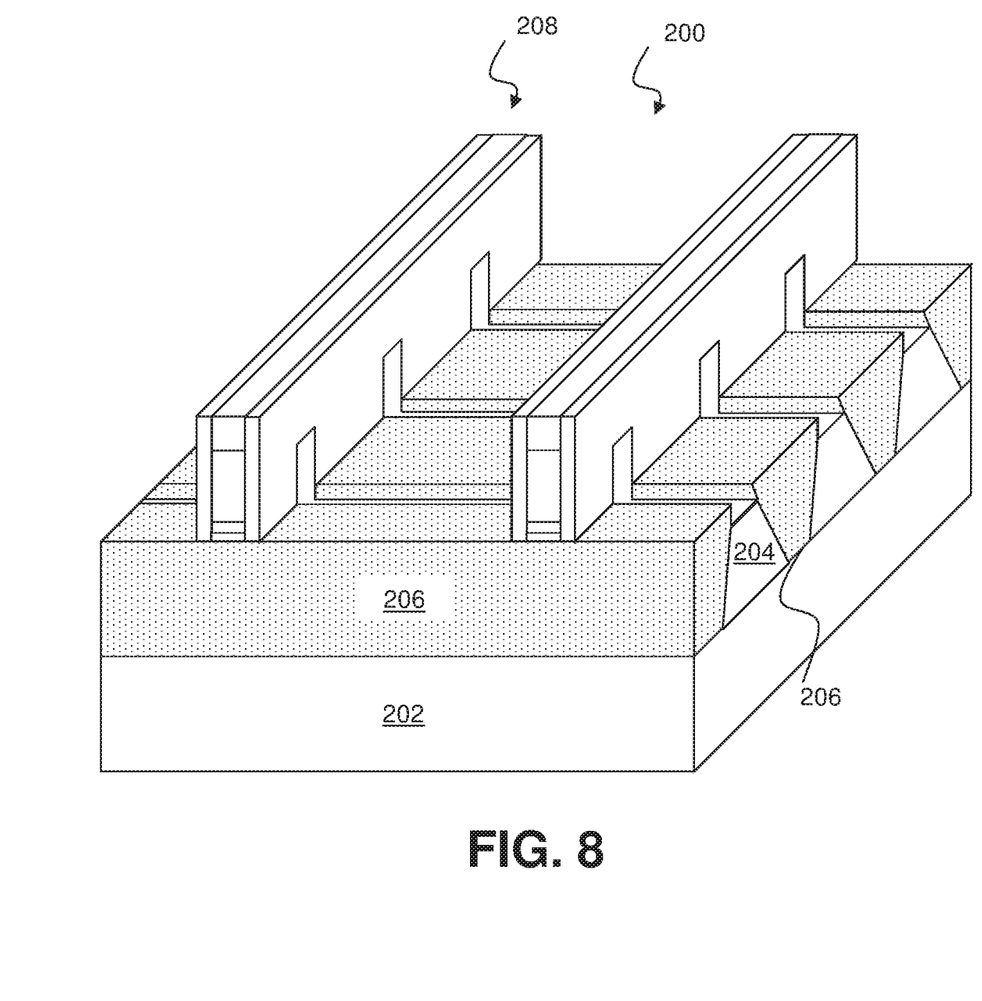
FIG. 8 is a diagrammatic perspective view of a FinFET precursor undergoing processes according to an embodiment of the present disclosure.

In some embodiments, after the FinFET precursor 200 undergoes a stress-memorization technique, secondary source/drain (S/D) regions may be formed. To do so, in block 112, the fin structure 204 may be partially removed as illustrated in FIG. 8. Any suitable amount of material may be removed. However, the amount removed has an effect on the presence of memorized stress in the secondary source/drain regions that will be formed later. Thus, the depth can be tailored to create or remove desired stress effects and dislocations within the secondary S/D regions and to control other characteristics of the device channel.

Removing a portion of the fin structure 204 may include forming a photoresist layer or a capping layer (such as an oxide capping layer) over the FinFET precursor 200, patterning the photoresist or capping layer to have openings that expose the S/D regions of the fin structure 204, and etching back material from the fin structure 204. In the depicted embodiment, the fin structure 204 is etched by a dry etching process. Alternatively, the etching process is a wet etching process, or combination dry and wet etching process. Removal may include a lithography process to facilitate the etching process. The lithography process may include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography process is implemented or replaced by other methods, such as maskless photolithography, electron-beam writing, and ion-beam writing. In yet another alternative, the lithography process could implement nanoimprint technology.

Figure 9:
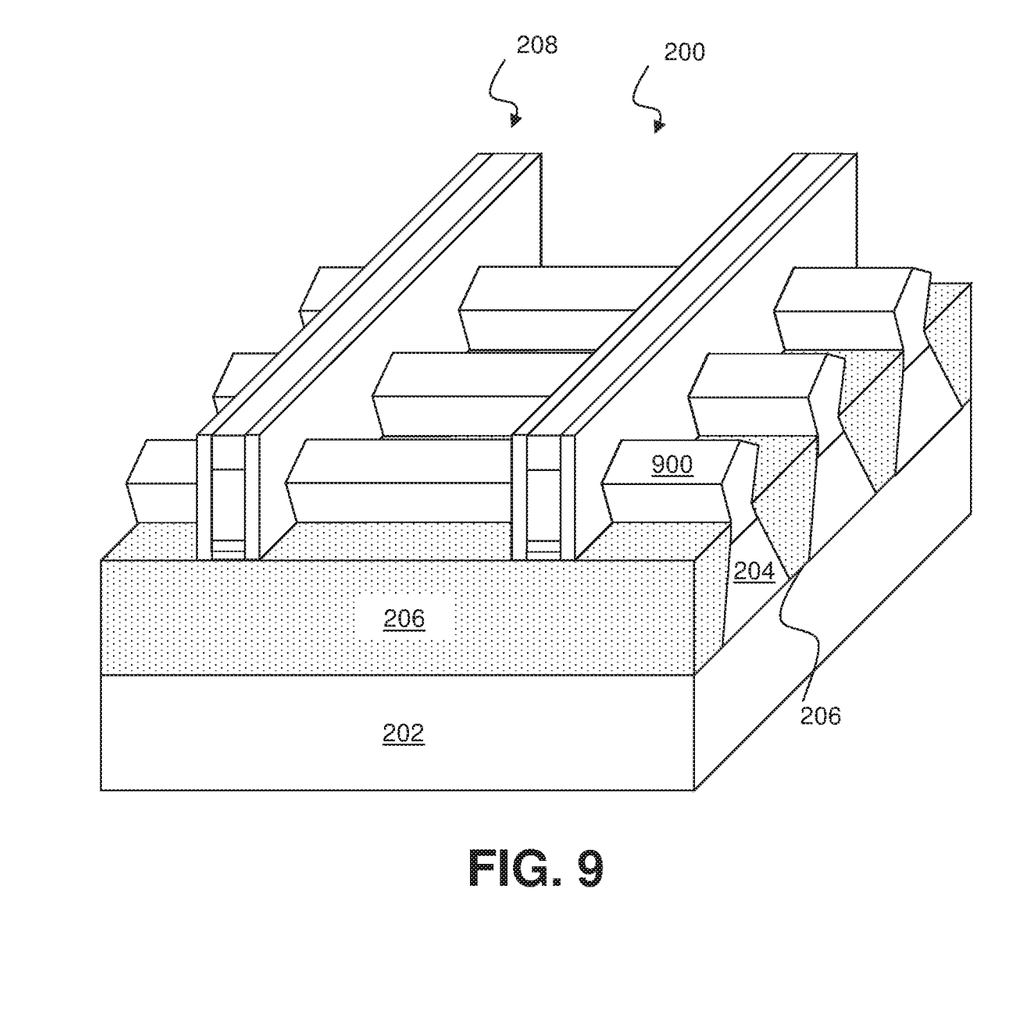
FIG. 9 is a diagrammatic perspective view of a FinFET precursor undergoing processes according to an embodiment of the present disclosure.

Referring to block 114 and FIG. 9, secondary source/drain (S/D) regions 900 are formed over the S/D regions of the fin structure 204. The secondary S/D regions 900 may be formed by one or more epitaxy or epitaxial (epi) processes, such that Si features, SiGe features, and/or other suitable features can be formed in a crystalline state on the fin structure 204. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the fin structure 204 (e.g., silicon). Thus, a strained channel can be achieved to increase carrier mobility and enhance device performance. The secondary S/D regions 900 may be in-situ doped. The doping species include p-type dopants, such as boron or $BF_2$; type dopants, such as phosphorus or arsenic; and/or other suitable dopants including combinations thereof. If the secondary S/D regions 900 are not in-situ doped, a second implantation process (i.e., a junction implant process) is performed to dope the secondary S/D regions 900. One or more annealing processes may be performed to activate the S/D regions 900. The annealing processes comprise rapid thermal annealing (RTA) and/or laser annealing processes.

Figure 10:
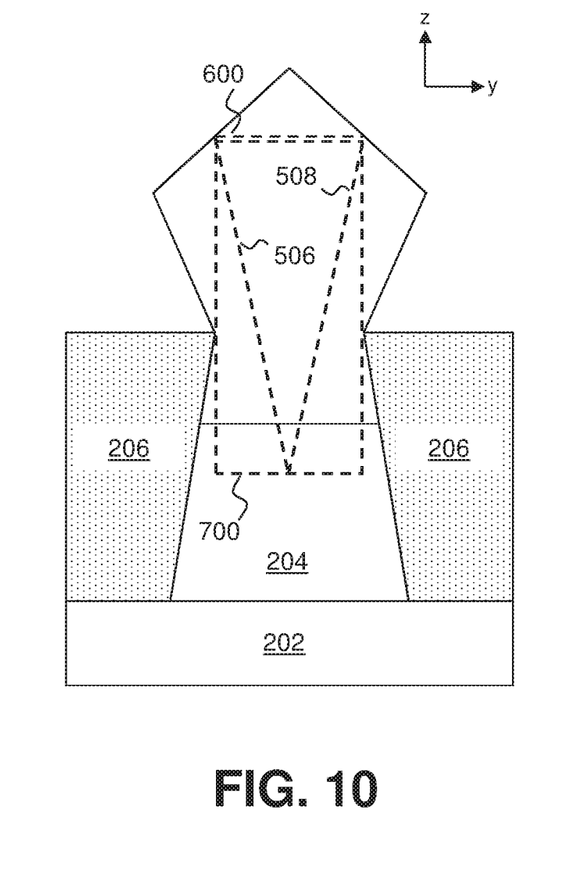
FIG. 10 is a diagrammatic cross-sectional view of a FinFET precursor undergoing processes according to an embodiment of the present disclosure.

The changes to the semiconductor lattice of the fin structure 204 caused by the stress-memory technique may propagate to the secondary S/D regions 900 which are formed on the fin structure 204. Thus, the S/D regions 900 may possess stress effects including dislocations along one or more planes as illustrated in FIG. 10. One exemplary plane is illustrated by plane 506. Plane 506 runs parallel to the longitudinal axis 502 of the fin structure 204 but is directed towards the surface of the substrate 202. In some embodiments, plane 506 corresponds to a 111 Miller index. Such a plane 506 intersects the surface of the substrate 202 at about a 55-degree angle. Likewise, plane 508 is similarly parallel to the longitudinal axis 502 of the fin structure 204 and directed towards the surface of the substrate 202. In some embodiments, plane 508 intersects the surface of the substrate 202 at about a 55-degree angle. A further exemplary plane, plane 600 is aligned parallel to the surface of the substrate 202 and parallel to both the longitudinal axis 502 and transverse axis 504 of the fin structure 204. Plane 700 lies parallel to the transverse axis 504 of the fin structure 204 but angles towards the surface of the substrate 202. These exemplary planes are not intended to be limiting, and a secondary S/D region 900 may possess dislocations along any one or more of these planes.

Referring to block 116, the FinFET 200 may undergo further CMOS or MOS technology processing to form various features known in the art. For example, a cleaning process may be performed to prepare the surface for S/D contact formation (e.g., S/D silicide formation). Subsequent processing may form various contacts/vias/lines and multilayer interconnect features (e.g., metal layers and interlayer dielectrics) on the substrate 202, configured to connect the various features or structures of the FinFET 200. The additional features may provide electrical interconnection to the device including the formed gate structures. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Thus, the present invention provides a method for performing a stress memorization technique (SMT) on a FinFET and provides a FinFET with stress effects including multi-planar dislocations. In one embodiment, the method includes: receiving a FinFET precursor comprising: a substrate; a fin structure formed on the substrate; an isolation region formed on the substrate and isolating the fin structure; and a gate stack formed over a portion of the fin structure, thereby separating a source region of the fin structure from a drain region of the fin structure and creating a gate region therebetween; forming a stress-memorization technique (SMT) capping layer over at least a portion of each of the fin structures, the isolation region, and the gate stack; performing a pre-amorphization implant on the FinFET precursor by implanting an energetic doping species; performing an annealing process on the FinFET precursor; and removing the SMT capping layer.

In a further embodiment, the semiconductor device comprises: a substrate having a surface; a fin structure formed over the surface of the substrate, the fin structure having an elongated body, a longitudinal axis, and a transverse axis parallel to the surface of the substrate, wherein the fin structure has a dislocation; an isolation region formed on the surface of the substrate and isolating the fin structure; and a gate stack formed over a portion of the fin structure, thereby separating a source region of the fin structure and a drain region of the fin structure and creating gate region of the fin structure therebetween.

In yet another embodiment, the semiconductor device comprises: a substrate having a surface; an elevated device body formed over the surface of the substrate, the elevated device body comprising a drain region, a source region, and a gate region located between the drain and source regions, wherein the elevated device body has a longitudinal axis and a transverse axis parallel to the surface of the substrate; a dislocation formed within the elevated device body; an isolation region formed on the surface of the substrate and isolating the elevated device body; and a gate stack formed over a portion of the gate region of the elevated device body.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   receiving a fin-like field effect (FinFET) precursor, wherein the FinFET precursor includes a fin extending from a substrate, an isolation feature disposed over the substrate and along a lower portion of the fin, and a gate structure disposed over a channel region of the fin, wherein the gate structure is disposed between an upper portion of a source region of the fin and an upper portion of a drain region of the fin;
   forming a capping layer over the FinFET precursor, wherein the capping layer covers the gate structure, the isolation feature, the upper portion of the source region of the fin, and the upper portion of the drain region of the fin;
   performing an implantation process that injects dopants through the capping layer and into the source region of the fin and the drain region of the fin, thereby producing an amorphous region within the source region of the fin and the drain region of the fin;
   before removing the capping layer, performing an annealing process to recrystallize the amorphous region within the source region of the fin and the drain region of the fin, wherein the implantation process and the annealing process are controlled to achieve a desired depth and a desired location of a pinchoff point in the source region of the fin and the drain region of the fin, wherein dislocations in the source region of the fin and the drain region of the fin propagate from the pinchoff point along one or more planes;
   after removing the capping layer, etching the upper portion of the source region of the fin and the upper portion of the drain region of the fin to form a first source/drain recess in the source region of the fin and a second source/drain recess in the drain region of the fin; and
   after the etching, epitaxially growing a first source/drain feature in the first source/drain recess and a second source/drain feature in the second source/drain recess, wherein the first source/drain feature and the second source/drain feature include the dislocations that propagate from the pinchoff point along the one or more planes.

2. The method of claim 1, wherein a first plane of the one or more planes intersects a surface of the substrate at an angle of about 55°.

3. The method of claim 2, wherein the first plane of the one or more planes runs parallel to a longitudinal axis of the fin.

4. The method of claim 1, wherein the etching is controlled to achieve a desired stress effect in the first source/drain feature and the second source/drain feature.

5. The method of claim 1, wherein the etching is controlled to achieve a desired recess depth of the first source/drain recess and the second source/drain recess, wherein the etching removes one or more of the dislocations in the fin.

6. The method of claim 1, wherein the forming the capping layer includes performing a chemical vapor deposition process to form a silicon nitride layer.

7. The method of claim 1, wherein the forming the capping layer includes performing a chemical vapor deposition process to form a silicon oxide layer.

8. The method of claim 1, wherein:
a temperature of the annealing process is about 200° C. to about 700° C.; and
a duration of the annealing process is about 50 seconds to about 300 seconds.

9. The method of claim 8, wherein the temperature is about 500° C. and the duration is about 180 seconds.

10. A method comprising:
receiving a fin-like field effect (FinFET) precursor, wherein the FinFET precursor includes a fin extending from a substrate, an isolation feature disposed over the substrate and along a lower portion of the fin, and a gate structure disposed over a channel region of the fin, wherein the gate structure is disposed between an upper portion of a source region of the fin and an upper portion of a drain region of the fin;
depositing a capping layer over the FinFET precursor, wherein the capping layer covers the gate structure, the isolation feature, the upper portion of the source region of the fin, and the upper portion of the drain region of the fin;
performing an implantation process that injects germanium dopants through the capping layer and into the source region of the fin and the drain region of the fin, thereby producing an amorphous region within the source region of the fin and the drain region of the fin;
before etching the capping layer, performing an annealing process to recrystallize the amorphous region within the source region of the fin and the drain region of the fin;
wherein the implantation process and the annealing process are controlled to achieve a desired depth and a desired location of a pinchoff point in the source region of the fin and the drain region of the fin, wherein dislocations in the source region of the fin and the drain region of the fin propagate from the pinchoff point along one or more planes; and
after etching the capping layer, epitaxially growing a first source/drain feature over the source region of the fin and a second source/drain feature over the drain region of the fin.

11. The method of claim 10, wherein the depositing the capping layer includes performing a chemical vapor deposition process using a silicon precursor.

12. The method of claim 10, wherein the depositing the capping layer includes performing a plasma enhanced chemical vapor deposition process using a silicon precursor.

13. The method of claim 10, wherein a first plane of the one or more planes corresponds to a 111 Miller index and intersects a surface of the substrate at an angle of about 55°.

14. The method of claim 10, wherein the etching the capping layer includes exposing the capping layer to phosphoric acid.

15. The method of claim 10, wherein the etching the capping layer includes exposing the capping layer to hydrofluoric acid.

16. A method comprising:
receiving a fin-like field effect (FinFET) precursor, wherein the FinFET precursor includes a silicon fin extending from a substrate, an isolation feature disposed over the substrate and along a lower portion of the silicon fin, and a gate structure disposed over a channel region of the silicon fin, wherein the gate structure is disposed between an upper portion of a source region of the silicon fin and an upper portion of a drain region of the silicon fin;
forming a silicon nitride capping layer over the FinFET precursor, wherein the silicon nitride capping layer covers the gate structure, the isolation feature, the upper portion of the source region of the silicon fin, and the upper portion of the drain region of the silicon fin;
performing an implantation process that injects dopants through the silicon nitride capping layer and into the source region of the silicon fin and the drain region of the silicon fin, thereby producing an amorphous region within the source region of the silicon fin and the drain region of the silicon fin;
before removing the silicon nitride capping layer, performing an annealing process to recrystallize the amorphous region within the source region of the silicon fin and the drain region of the silicon fin;
wherein the implantation process and the annealing process are controlled to achieve a desired depth and a desired location of a pinchoff point in the source region of the silicon fin and the drain region of the silicon fin, wherein dislocations in the source region of the silicon fin and the drain region of the silicon fin propagate from the pinchoff point along one or more planes; and
after removing the silicon nitride capping layer, epitaxially growing a first source/drain feature over the source region of the silicon fin and a second source/drain feature over the drain region of the silicon fin.

17. The method of claim 16, wherein a first plane of the one or more planes corresponds to a 111 Miller index and intersects a surface of the substrate at an angle of about 55°.

18. The method of claim 16, wherein the amorphous region extends into the lower portion of the silicon fin.

19. The method of claim 16, wherein removing the silicon nitride capping layer includes performing a wet etching process that uses phosphoric acid.

20. The method of claim 16, wherein the dopants are germanium dopants.

* * * * *